(12) United States Patent
Ito

(10) Patent No.: US 7,133,106 B2
(45) Date of Patent: Nov. 7, 2006

(54) LIQUID CRYSTAL DISPLAY DEVICE WITH FLEXIBLE PRINTED CIRCUIT BOARD

(75) Inventor: Takae Ito, Kawasaki (JP)

(73) Assignee: Sharp Kabushiki Kaisha, Osaka (JP)

( * ) Notice: Subject to any disclaimer, the term of this patent is extended or adjusted under 35 U.S.C. 154(b) by 59 days.

(21) Appl. No.: 10/613,803

(22) Filed: Jul. 3, 2003

(65) Prior Publication Data

US 2004/0012745 A1 Jan. 22, 2004

(30) Foreign Application Priority Data

Jul. 22, 2002 (JP) ............................. 2002-212998
Mar. 28, 2003 (JP) ............................. 2003-091602

(51) Int. Cl.
*G02F 1/1345* (2006.01)

(52) U.S. Cl. ....................... 349/150; 349/149; 349/152

(58) Field of Classification Search ................ 349/150, 349/149, 152
See application file for complete search history.

(56) References Cited

U.S. PATENT DOCUMENTS 5,737,272 A * 4/1998 Uchiyama et al. .......... 345/206

| | | | |
|---|---|---|---|
| 6,345,887 B1 * | 2/2002 | Sato | 347/72 |
| 6,525,718 B1 * | 2/2003 | Murakami et al. | 345/206 |
| 6,532,055 B1 * | 3/2003 | Oishi | 349/149 |
| 2001/0024183 A1 * | 9/2001 | Ode et al. | 345/87 |
| 2002/0057235 A1 * | 5/2002 | Murai et al. | 345/84 |

FOREIGN PATENT DOCUMENTS

| JP | 07-049657 | 2/1995 |
|---|---|---|
| JP | 07-120772 | 5/1995 |
| JP | 09-044100 | 2/1997 |

* cited by examiner

*Primary Examiner*—Andrew Schechter
*Assistant Examiner*—Phu Vu
(74) *Attorney, Agent, or Firm*—Greer, Burns & Crain,Ltd

(57) ABSTRACT

A liquid crystal display device has a liquid crystal panel displaying an image. A printed circuit board is arranged along one side of the liquid crystal panel, and a plurality of flexible printed circuit boards connect the liquid crystal panel and the printed circuit board. At least two driver ICs are mounted on each flexible printed circuit board and the at least two driver ICs are cascaded with respect to input signals.

4 Claims, 3 Drawing Sheets

LIQUID CRYSTAL DISPLAY DEVICE WITH FLEXIBLE PRINTED CIRCUIT BOARD

BACKGROUND OF THE INVENTION

1. Field of the Invention

The present invention relates to a liquid crystal display device including a driver.

2. Description of the Related Art

A liquid crystal display device comprises a liquid crystal panel for displaying an image, a printed circuit board arranged along one side of the liquid crystal panel, and a plurality of flexible printed circuit boards connecting the liquid crystal panel and the printed wiring board and having driver ICs mounted thereon (for example, Japanese Unexamined Patent Publication (Kokai) No. 9-44100 and No. 7-49657). Source bus electrodes are arranged along one side of the liquid crystal panel and gate bus electrodes are arranged along another side of the liquid crystal panel. The source bus electrodes are mainly described here, that is, the description of one side of the liquid crystal panel is given here.

Each flexible printed circuit board has a drive IC. Display data signals, voltage signals and control signals are input to the input terminals of the printed circuit board. The output terminals of the printed circuit board are connected to the input terminals of the flexible printed circuit board and the input terminals of the flexible printed circuit board are connected to the driver IC. The driver IC converts the input signals into liquid crystal drive signals, which are then supplied to the source bus terminals of the liquid crystal panel via the output terminals of the flexible printed circuit board. The liquid crystal is driven by the input signals supplied in this manner.

Recently, as the liquid crystal display device has become more compact and its resolution has become finer, the number of input and output terminals of the flexible printed circuit board has increased, resulting in an arrangement of input and output terminals with a narrower pitch. The input terminals of the flexible printed circuit boards are connected to the output terminals of the printed circuit board with an anisotropic conductive adhesive (ACF). As the pitch of the input terminals of the flexible printed circuit board becomes narrower, the pitch of the output terminals of the printed circuit board to be connected thereto also becomes narrower.

If the pitch of the output terminals of the printed circuit board becomes, for example, 0.3 mm or less, the pitch of the input terminals of the flexible printed circuit board may become different from that of the output terminals of the printed circuit board, resulting in shift in position, owing to the thermal contraction of the printed circuit board material, when the flexible printed circuit board and the printed circuit board are bonded with the ACF. However, if a special material with low coefficient of contraction is used for the printed circuit board, the cost of the printed circuit board is increased.

SUMMARY OF THE INVENTION

It is an object of the present invention to provide a liquid crystal display device enabling a secure connection between the input terminals of a flexible printed circuit board and the output terminals of a printed circuit board even when the pitch of the input terminals of the flexible printed circuit board is narrow.

A liquid crystal display device, according to the present invention, comprises a liquid crystal panel displaying an image, and at least one flexible printed circuit board arranged on one side of the liquid crystal panel and having driver ICs mounted thereon, wherein at least two driver ICs are mounted on each flexible printed circuit board and the at least two driver ICs are cascaded with respect to input signals.

In a specific aspect, a liquid crystal display device comprises a liquid crystal panel displaying an image, a printed circuit board arranged along one side of the liquid crystal panel, and a plurality of flexible printed circuit boards connecting the liquid crystal panel and the printed circuit board and having driver ICs mounted thereon, wherein at least two driver ICs are mounted on each flexible printed circuit board and the at least two driver ICs are cascaded with respect to input signals.

In this structure, as the driver ICs that are cascaded are mounted on each flexible printed circuit board, the number of input terminals of the flexible printed circuit board can be reduced in total, therefore, it is possible to increase the width of the flexible printed circuit board and, as a result, the pitch of the input terminals of the flexible printed circuit board. Because of this, even in the case where the pitch of the input terminals of the flexible printed circuit board might conventionally become narrower, the input terminals of the flexible printed circuit board can be securely connected to the output terminals of the printed circuit board.

BRIEF DESCRIPTION OF THE DRAWINGS

The present invention will become more apparent from the following description of the preferred embodiments, with reference to the accompanying drawings, in which.

DESCRIPTION OF THE PREFERRED EMBODIMENTS

Preferred embodiments of the present invention are described below with reference to the drawings.

Figure 1:
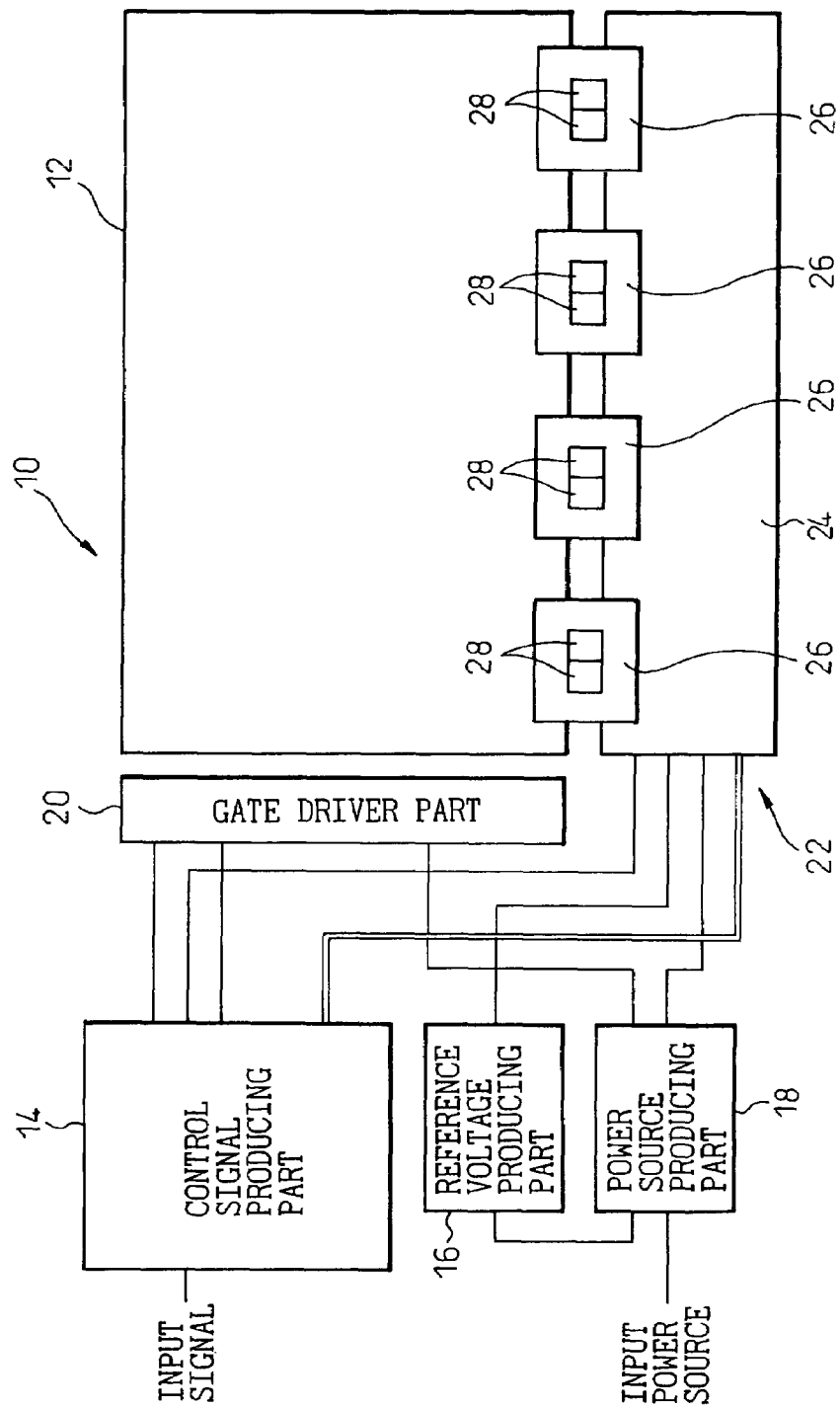
FIG. 1 is a view illustrating a liquid crystal display device in one embodiments of the present invention.

FIG. 1 is a view illustrating a liquid crystal display device in one embodiment of the present invention. A liquid crystal display device 10 includes a liquid crystal panel 12 displaying an image. The liquid crystal panel 12 comprises a pair of glass substrates and a liquid crystal interposed therebetween. One of the glass substrates is a TFT substrate comprising a plurality of pixel electrodes, TFTs, bus lines extending vertically and horizontally, and bus terminals provided on the ends of the bus lines. Gate bus lines extend horizontally in FIG. 1, with gate bus terminals provided at their left ends, and source bus lines extend vertically in FIG. 1, with source bus terminals provided at their lower ends.

The liquid crystal display device 10 comprises a control signal producing part 14, a reference voltage producing part 16, a power source producing part 18, a gate driver part 20 and a source driver part 22. The gate driver part 20 is connected to the gate bus terminals and the source driver part 22 is connected to the source bus terminals. An input signal is supplied to the control signal producing part 14 and an input power source is connected to the power source producing part 18. The source driver part 22 is described in detail below. The gate driver part 20 may have a structure similar to or different from that of the source driver part 22.

The source driver part 22 comprises a printed circuit board 24 arranged along and spaced apart from one side of the liquid crystal panel 12 and a plurality of flexible printed circuit boards 26 connecting the liquid crystal panel 12 to the printed circuit board 24. The flexible printed circuit boards 26 are made of TCP. At least two driver ICs (IC chips) 28 are mounted on each flexible printed circuit board 26 and these driver IC's are cascaded (cascade-connected) with respect to the input signals. In the embodiment, each flexible printed circuit board 26 has two driver ICs 28, that is, a first driver IC 28 located on the left side and a second driver IC 28 located on the right side in the figures.

Figure 2:
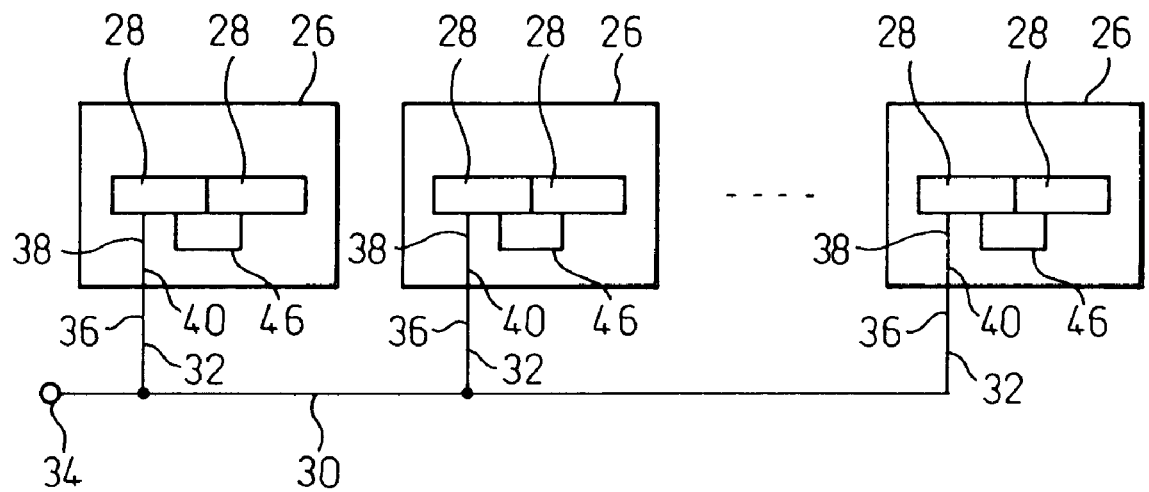
FIG. 2 is a view illustrating the connection between the printed circuit board and the flexible printed circuit boards of the liquid crystal display device in FIG. 1.

FIG. 2 is a view illustrating the connection between the printed circuit board 24 and the flexible printed circuit boards 26 of the liquid crystal display device 10 in FIG. 1. The printed circuit board 24 includes main wiring (conductors) 30 and branch wiring (conductors) 32 branching from the main wiring 30. Input terminals 34 are formed at the ends of conductors of the main wiring 30 and output terminals 36 are formed at the ends of conductors of branch wiring 32.

Figure 3:
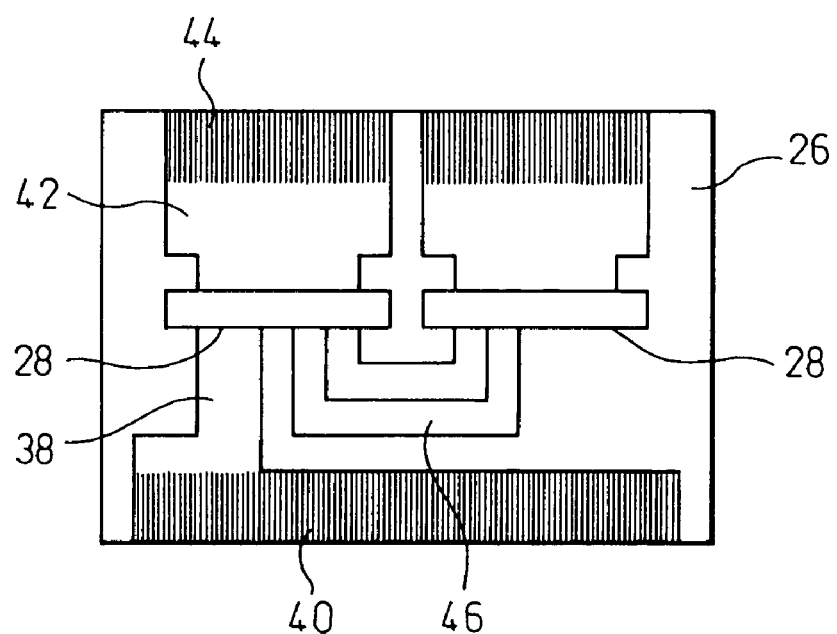
FIG. 3 is a plan view illustrating the flexible printed circuit board of the liquid crystal display device in FIGS. 1 and 2.

FIG. 3 is a plan view illustrating the flexible printed circuit board 26 of the liquid crystal display device in FIGS. 1 and 2. As shown in FIGS. 2 and 3, the flexible printed circuit board 26 comprises input wiring (conductors) 38, input terminals 40 provided at the ends of conductors of the input wiring 38, output wiring 42, and output terminals 44 provided at the ends of conductors of the output wiring 42. The output wiring 42 extends from the first and the second driver IC's 28, respectively. The output terminals 36 of the printed circuit board 24 are connected to the input terminals 40 of the flexible printed circuit boards 26 with the anisotropic conductive adhesive (ACF). The output terminals 44 of the flexible printed circuit board 26 are connected to the source bus electrodes of the liquid crystal panel 12 with the anisotropic conductive adhesive (ACF).

Each flexible printed circuit board 26 comprises input terminals 40 the number of which is the same as that of input terminals of the first driver IC 28 and the input wiring 38 is connected only to the first driver IC 28. Moreover, there is provided internal wiring (conductors) 46 connecting the output terminals of the first driver IC 28, which is connected to the input wiring 38, to the input terminals of the second driver IC, which is not connected to the input wirings 38. The internal wiring 46 cascades the input signal of the two driver ICs 28.

Display data signals, voltage signals and control signals are input to the input terminals 34 of the printed circuit board 24. For example, 48 input terminals 34 are used for the display data signal, 18 input terminals 34 are used for the tone voltage, 9 input terminals 34 are used for the power line, and 15 input terminals 34 are used for the control signal.

There are 90 input terminals 34 in total and the main wiring 30 and respective branch wiring 32 include 90 electric conductors. The number of output terminals 36 provided at the ends of respective branch wiring 32 is 90 and the number of input terminals 40 and input wirings 38 of the flexible printed circuit board 26 is also 90. The number of output wirings 42 and output terminals 44 extending from each driver IC 28 of the flexible printed circuit board 26 is 384. Moreover, there are 90 internal wirings 46. As a result, the first driver IC 28 further includes 90 output terminals and the second driver IC further includes 90 input terminals.

Therefore, the input signals transmitting through respective branch wirings 32 and the input wiring 38 are supplied to the first driver IC 28 and at the same time to the second driver IC 28 via the first driver IC 28. As a result, it is possible to supply the input signals to both driver ICs 28 with the same number of input terminals 40 of the flexible printed circuit board 26 as that of input terminals of one driver IC 28.

Figure 4:
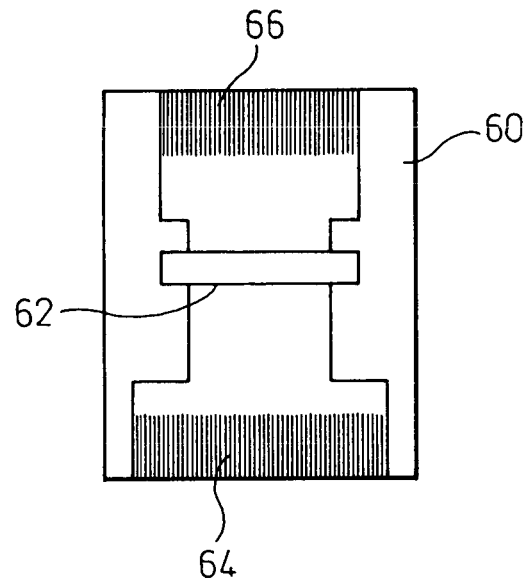
FIG. 4 is a plan view illustrating a flexible printed circuit board used in a conventional liquid crystal display device.

FIG. 4 is a plan view illustrating the flexible printed circuit board used in a conventional liquid crystal display device. A flexible printed circuit board 60 comprises a driver IC 62, 90 input printed circuit board 64 and 384 output terminals 66.

For example, there are 3840 source bus lines in an SXGA liquid crystal display device. Therefore, if a driver IC 28 has 384 output terminals, 10 driver ICs 28 are necessary. Conventionally, 10 flexible printed circuit boards 26 are necessary because a flexible printed circuit board has one driver IC 62. Under the restrictions of the size of a liquid crystal display device, if the limit of the width of a flexible printed circuit board 26 is assumed to be 25 mm, the pitch of the input terminal 64 is $25/90$ mm=0.277 mm, because the number of input terminals 64 of the flexible printed circuit board 26 is 90.

In the present invention, the flexible printed circuit board 26 is provided with two driver ICs 28, the number of output terminals 44 is equal to that of output terminals of the two driver ICs 28, and the number of input terminals 40 is equal to that of input terminals of one driver IC 28, and therefore, only five flexible printed circuit boards 26 are necessary to provide 10 driver ICs 28. As a result, the width of the flexible printed circuit board 26 can be doubled compared to a conventional one, and the pitch of the terminals can be increased. For example, if the width of the flexible printed circuit board 26 is 40 mm, the pitch of the input terminals 40 can be $40/90$ mm=0.44 mm because the number of input terminals 40 of the flexible printed circuit board 26 is 90. Moreover, it is also possible to increase the width of the flexible printed circuit board 26 by mounting two or more driver ICs 28 and cascading them.

Figure 5:
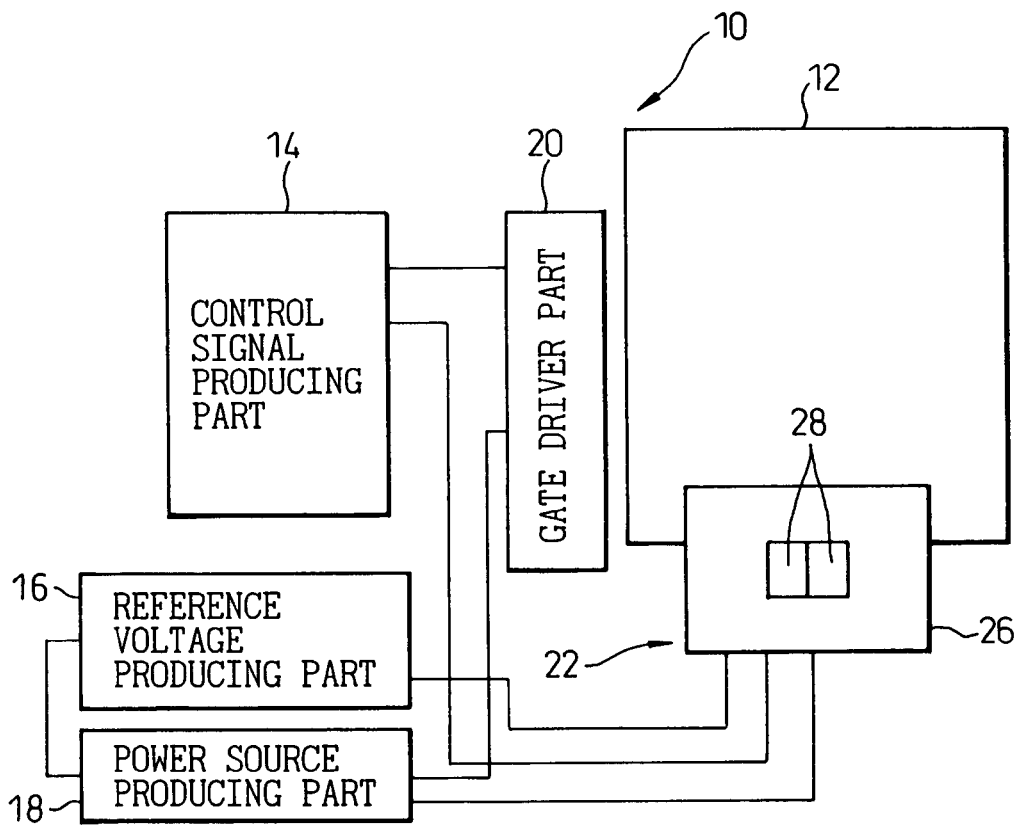
FIG. 5 is a view illustrating a liquid crystal display device in another embodiment of the present invention.

FIG. 5 is a view illustrating a liquid crystal display device in another embodiment of the present invention. A flexible printed circuit board 26 is mounted on one side of a small liquid crystal panel 12, the flexible printed circuit board 26 including two cascaded driver ICs 28. In this case too, it is possible to reduce the number of the input terminals of the flexible printed circuit board 26, whereby the width of the flexible printed circuit board 26 can be increased and the pitch of the input terminals of the flexible printed circuit board 26 can be widened, since the two cascaded driver ICs 28 are arranged in one flexible printed circuit board 26. Therefore, the input terminals of the flexible printed circuit board 26 can be reliably connected to the output terminals on any circuit which should be connected to the flexible printed circuit board 26, even in the case where the input terminals of the flexible printed circuit board might conventionally become narrower. In addition, in a conventional small liquid crystal panel, it is necessary to use a flexible printed circuit board to provide common signal wirings for connection to driver ICs so as to obtain a small sized module. However, in the conventional flexible printed circuit board having the driver ICs, the common signal wiring directed to the driver ICs are crossed each other, and the wiring of the flexible printed circuit board must be formed in a plurality of (more than two) layers. Therefore, the module was expensive. In the present invention, in which the flexible printed circuit board having the cascaded driver ICs is used, wiring of the flexible printed circuit board can be formed in a single layer, and it is possible to provide an inexpensive liquid crystal module.

In accordance with the present invention, as described above, it is possible to increase the pitch of the input terminals of the flexible printed circuit board having driver ICs, therefore, the driver ICs and the printed circuit board can be connected more easily, the manufacturing process can be simplified, and the cost of the material of the printed circuit board can be reduced.

The invention claimed is:

1. A liquid crystal display device comprising:
    a liquid crystal panel displaying an image;
    a printed circuit board arranged along one side of the liquid crystal panel; and
    a plurality of flexible circuit boards which connect the liquid crystal panel to the printed circuit board, the plurality of flexible circuit boards having at least two driver ICs mounted thereon, each driver IC outputting a liquid crystal driving signal to drive liquid crystal of the liquid crystal panel;
wherein:
    the printed circuit board includes a wiring system so arranged that a bundle of main wirings, which receive an input signal, have plural bundles of branch wirings, each bundle of the branch wirings outputting the input signal to one of the driver ICs mounted on the flexible circuit board, and
    the driver ICs in each flexible circuit board are cascaded to each other with respect to the input signal by internal wirings in the flexible circuit board.

2. The liquid crystal display device as set forth in claim 1, wherein each flexible circuit board has input terminals the number of which is the same as that of input terminals of one driver IC.

3. The liquid crystal display device as set forth in claim 1, wherein the internal wirings are on a side of the printed circuit board with respect to the driver ICs.

4. The liquid crystal display device as set forth in claim 1, wherein the bundles of the branch wirings are branched from the main wirings at positions different from one another.

* * * * *